(12) United States Patent
Tsujino et al.

(10) Patent No.: US 8,952,518 B2
(45) Date of Patent: Feb. 10, 2015

(54) SEMICONDUCTOR DEVICE HOUSING PACKAGE, AND SEMICONDUCTOR APPARATUS AND ELECTRONIC APPARATUS INCLUDING THE SAME

(75) Inventors: Mahiro Tsujino, Kyoto (JP); Manabu Miyahara, Kyoto (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 14/006,527

(22) PCT Filed: Jul. 20, 2012

(86) PCT No.: PCT/JP2012/068436
§ 371 (c)(1),
(2), (4) Date: Sep. 20, 2013

(87) PCT Pub. No.: WO2013/015216
PCT Pub. Date: Jan. 31, 2013

(65) Prior Publication Data
US 2014/0008780 A1    Jan. 9, 2014

(30) Foreign Application Priority Data
Jul. 26, 2011   (JP) ................. 2011-163426

(51) Int. Cl.
*H01L 23/48*   (2006.01)
*H01L 23/00*   (2006.01)
(Continued)

(52) U.S. Cl.
CPC .............. *H01L 24/42* (2013.01); *H01L 23/057* (2013.01); *H01L 23/10* (2013.01); *H01L 2224/48091* (2013.01); *H01L 2224/49171* (2013.01); *H01L 2924/171* (2013.01); *H01L 24/48* (2013.01);

(Continued)

(58) Field of Classification Search
CPC ..... H01L 23/10; H01L 23/057; H01L 23/047; H01L 24/42; H01L 24/49
USPC .......................................... 257/673, 680, 690
See application file for complete search history.

(56) References Cited

U.S. PATENT DOCUMENTS
2010/0252313 A1   10/2010  Tsujino
2013/0307135 A1*  11/2013  Ueda et al. ............. 257/698

FOREIGN PATENT DOCUMENTS
JP         63216366 A        9/1988
JP         2003-188300    *  7/2003
(Continued)

OTHER PUBLICATIONS
International Search Report, PCT/JP2012/068436, Oct. 5, 2012, 1 pp.

*Primary Examiner* — Ahmed Sefer
(74) *Attorney, Agent, or Firm* — Volpe and Koenig, P.C.

(57) ABSTRACT

A semiconductor device housing package includes a base body having, on its upper surface, a mounting region of a semiconductor device; a frame body having a frame-like portion disposed on the upper surface of the base body, surrounding the mounting region, and an opening penetrating through from an inner side of the frame-like portion to an outer side thereof; a flat plate-like insulating member disposed in the opening, extending from an interior of the frame body to an exterior thereof; wiring conductors disposed on an upper surface of the insulating member, extending from the interior of the frame body to the exterior thereof; and a metallic film disposed on a part of the upper surface of the insulating member, the metallic film lying outside the frame body surrounding the wiring conductors.

6 Claims, 8 Drawing Sheets

(51) Int. Cl.
*H01L 23/057* (2006.01)
*H01L 23/10* (2006.01)

(52) U.S. Cl.
CPC ....... *H01L 24/49* (2013.01); *H01L 2224/48227* (2013.01); *H01L 2924/00014* (2013.01); *H01L 2924/16195* (2013.01); *H01L 2924/16251* (2013.01)
USPC .............................. 257/690; 257/673; 257/680

(56) References Cited

FOREIGN PATENT DOCUMENTS

| | | |
|---|---|---|
| JP | 2003218258 A | 7/2003 |
| JP | 2009010149 A | 1/2009 |
| JP | 2010199277 A | 9/2010 |
| WO | 2009057691 A1 | 5/2009 |

\* cited by examiner

FIG. 6
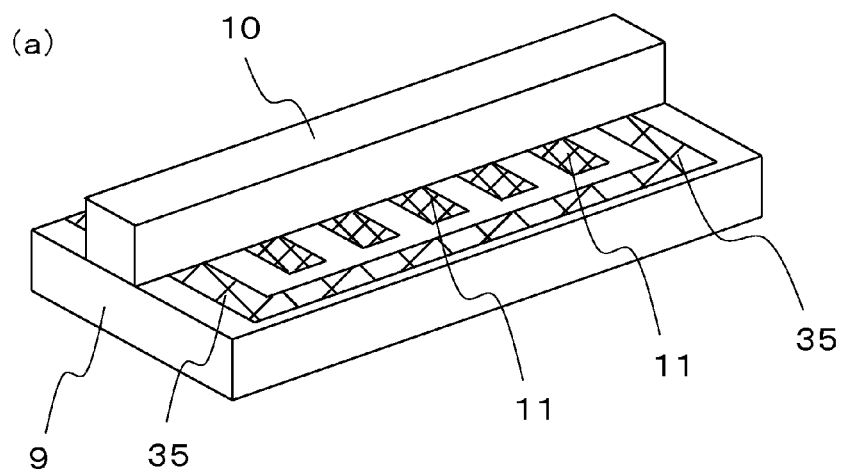
(a)
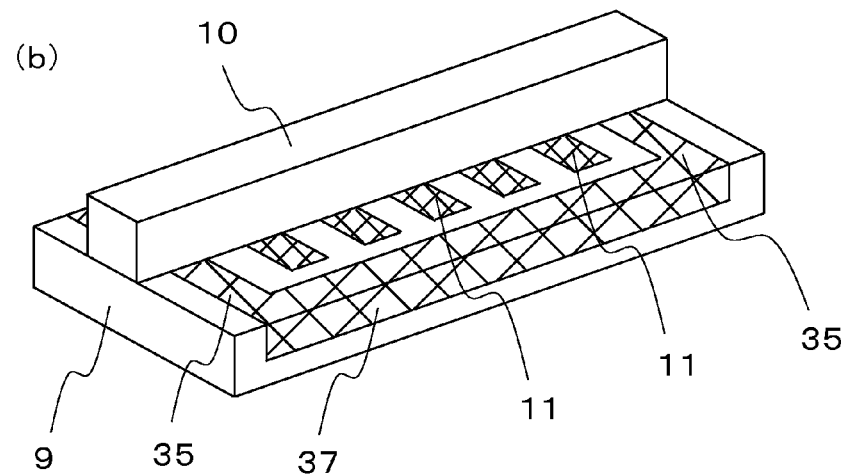
(b)

FIG. 7
(a)
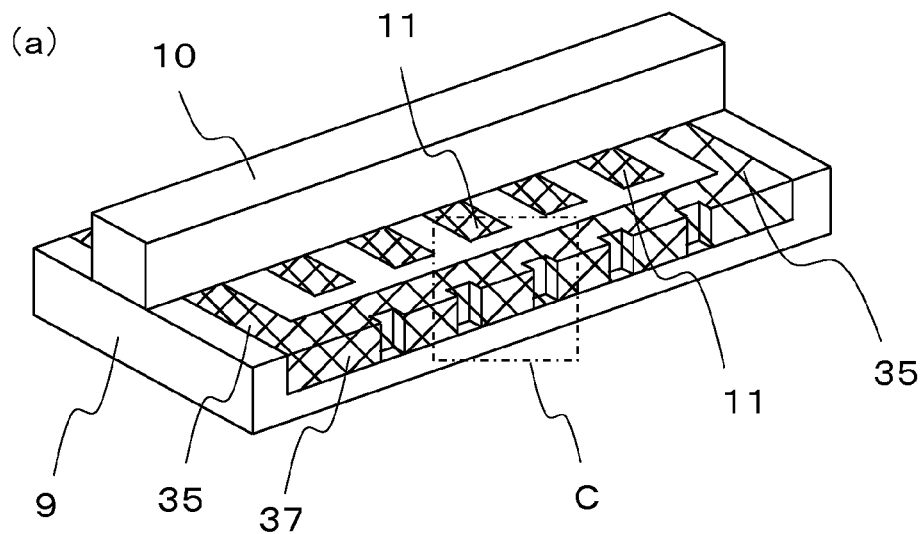
(b)
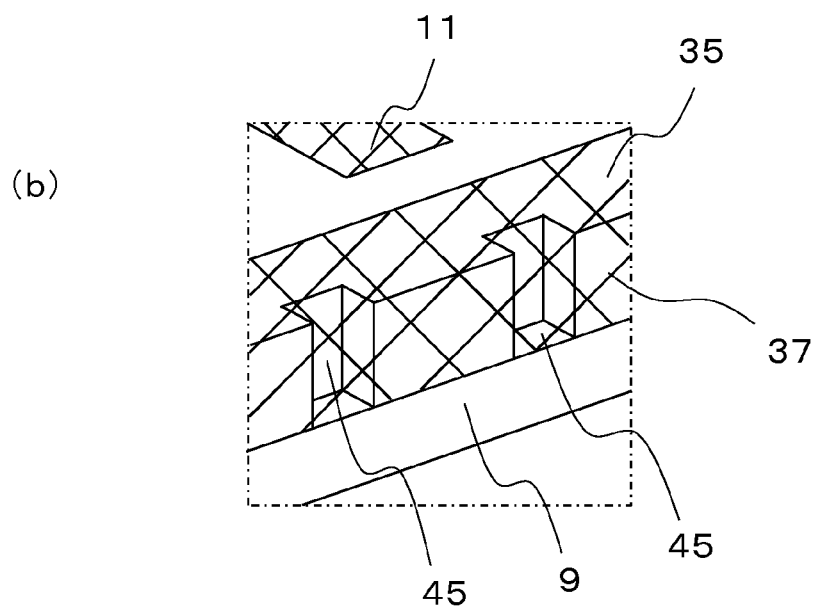

FIG. 8
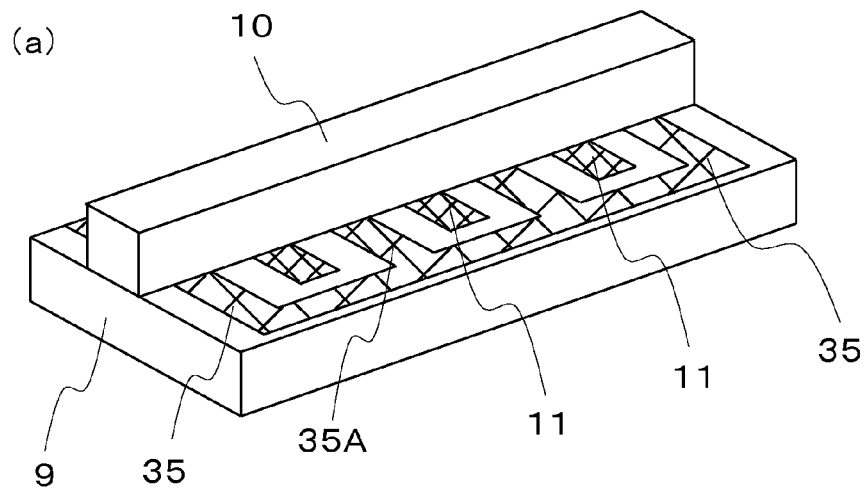
(a)
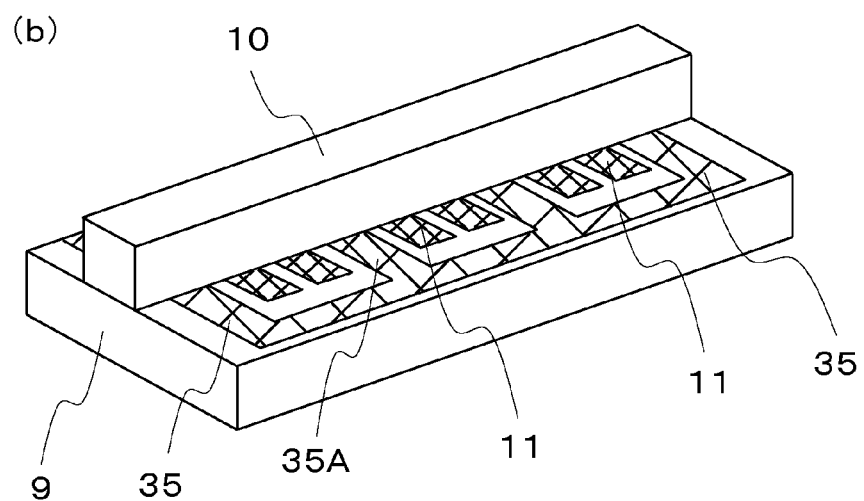
(b)

US 8,952,518 B2

SEMICONDUCTOR DEVICE HOUSING PACKAGE, AND SEMICONDUCTOR APPARATUS AND ELECTRONIC APPARATUS INCLUDING THE SAME

FIELD OF INVENTION

The present invention relates to a semiconductor device housing package for accommodating a semiconductor device, and a semiconductor apparatus and an electronic apparatus including the semiconductor device housing package. Such an electronic apparatus is used as a component constituting electronic equipment of various types.

BACKGROUND

As a package for accommodating a semiconductor device, there is known a construction comprising a substrate for placement of a semiconductor device, and an input-output terminal for providing electrical connection between the semiconductor device and an external electric circuit board (refer to Japanese Unexamined Patent Publication JP-A 2003-218258 and Japanese Unexamined Patent Publication JP-A 2010-199277, for example). In such a package, a plurality of metallization wiring layers are formed on the upper surface of the input-output terminal. Each of the metallization wiring layers is connected with a lead terminal for providing electrical connection between the metallization wiring layer and an external electric circuit board.

In recent years, downsizing has come to be demanded of packages. Moreover, as packages become more and more sophisticated, the number of lead terminals to be connected to an input-output terminal is on the increase. In a downsized package, or in the case of increasing the number of lead terminals to be connected to an input-output terminal, the spacing between adjacent lead terminals will be narrowed, which may pose the risk of electrical short-circuiting between the lead terminals.

An object of the invention is to provide a semiconductor device housing package that requires no lead terminal.

SUMMARY

A semiconductor device housing package in accordance with one aspect of the invention comprises: a base body having, on its upper surface, a mounting region of a semiconductor device; a frame body having a frame-like portion disposed on the upper surface of the base body, surrounding the mounting region, and an opening penetrating through from an inner side of the frame-like portion to an outer side thereof; and a flat plate-like insulating member disposed in the opening, extending from an interior of the frame body to an exterior thereof. Moreover, the semiconductor device housing package includes a plurality of wiring conductors disposed on an upper surface of the flat plate-like insulating member, extending from the interior of the frame body to the exterior thereof, and a metallic film disposed on a part of the upper surface of the flat plate-like insulating member, the metallic film lying outside the frame body surrounding the plurality of wiring conductors.

A semiconductor apparatus in accordance with one aspect of the invention comprises: the above-described semiconductor device housing package; a semiconductor device placed in the mounting region; and a metal-made lid body joined to the frame body covering the semiconductor device.

An electronic apparatus in accordance with one aspect of the invention comprises: the above-described semiconductor apparatus; a mounting board on which the semiconductor apparatus is mounted; an electronic component mounted on the mounting board; and a resin substrate having second wiring conductors which differ from the plurality of wiring conductors, the second wiring conductors being electrically connected to the plurality of wiring conductors.

BRIEF DESCRIPTION OF THE DRAWINGS

FIG. 6($a$) is a perspective view showing an insulating member, wiring conductors, and a metallic film provided in the semiconductor device housing package shown in FIG. 1, and FIG. 6($b$) is a perspective view showing a first modified example of the construction shown in FIG. 6($a$);

FIG. 7($a$) is a perspective view showing a second modified example of the construction shown in FIG. 6($a$), and FIG. 7($b$) is an enlarged perspective view of a region C shown in FIG. 7($a$); and FIG. 8($a$) is a perspective view showing a third modified example of the construction shown in FIG. 6($a$), and FIG. 8($b$) is a perspective view showing a fourth modified example of the construction shown in FIG. 6($a$).

DETAILED DESCRIPTION OF THE PREFERRED EMBODIMENTS

Figure 1:
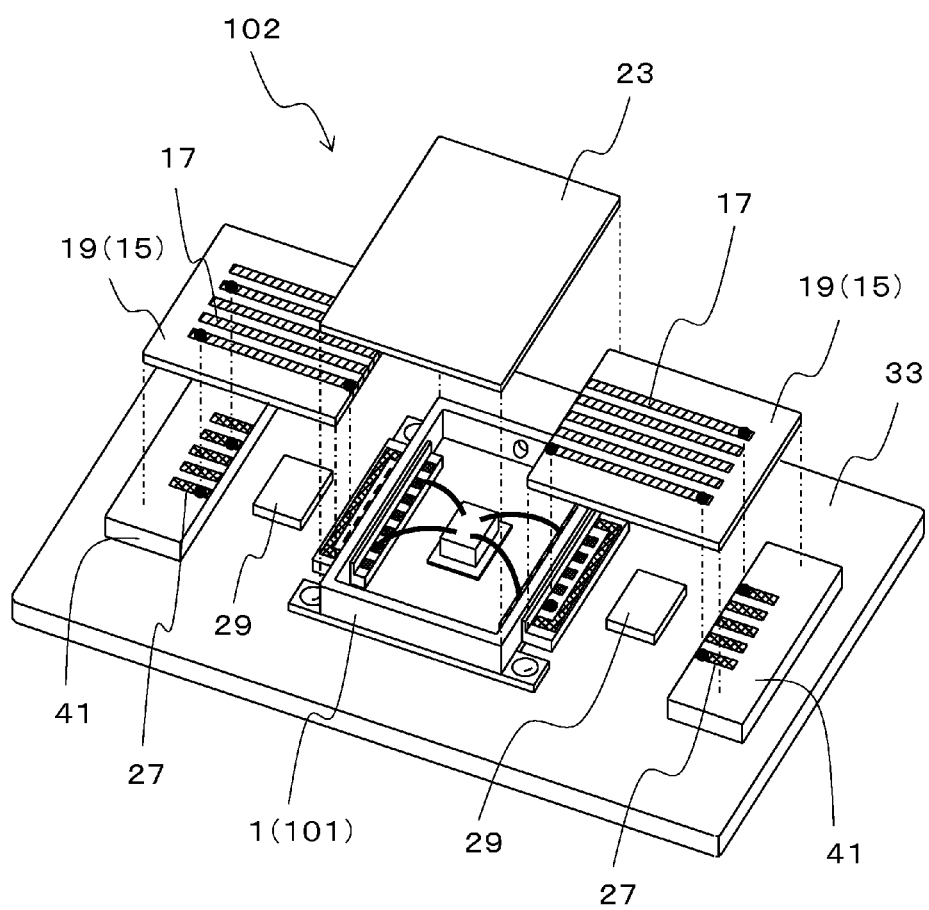
FIG. 1 is an exploded perspective view showing a semiconductor device housing package, and a semiconductor apparatus and an electronic apparatus in accordance with a first embodiment of the invention.
Figure 2:
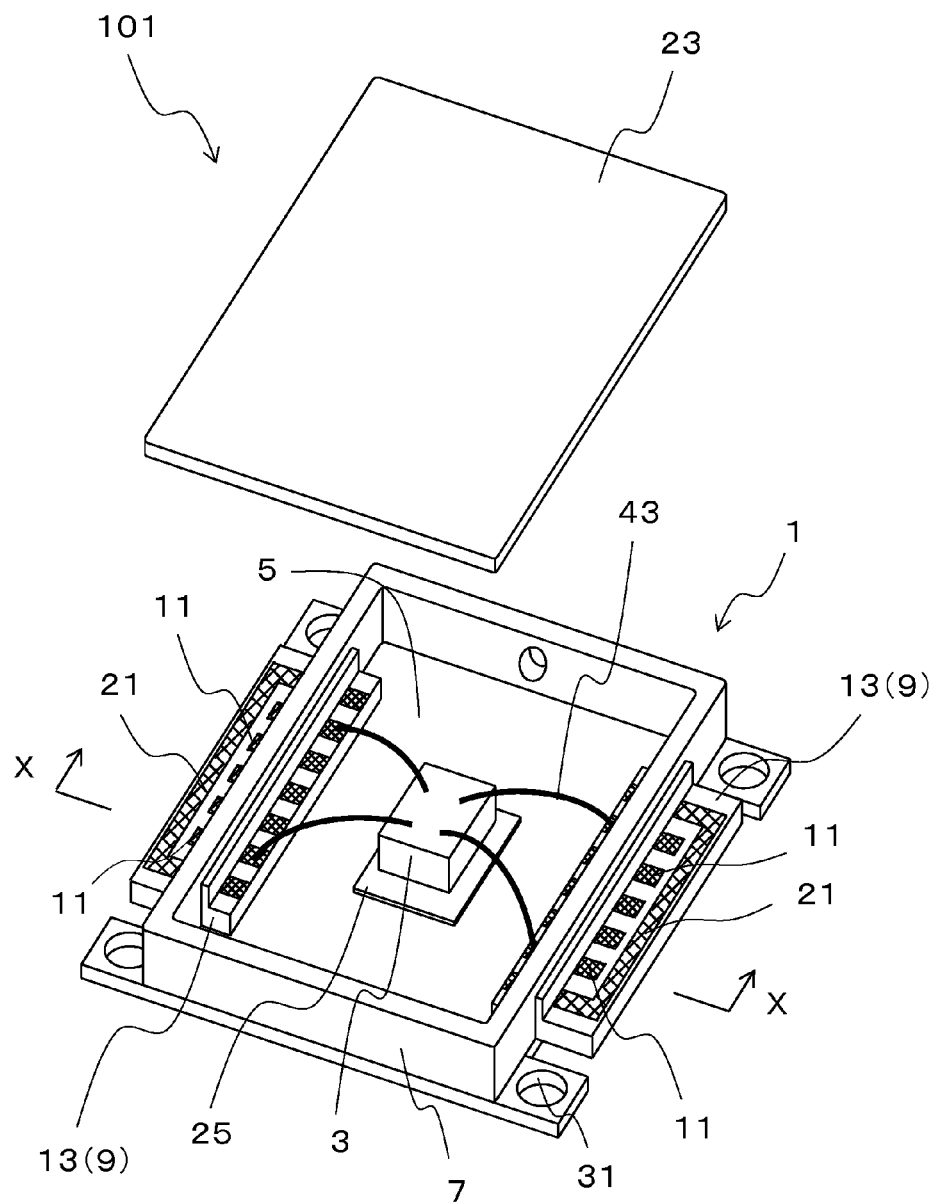
FIG. 2 is an enlarged perspective view of the semiconductor device housing package and the semiconductor apparatus.

Hereinafter, a semiconductor device housing package, and a semiconductor apparatus and an electronic apparatus including the semiconductor device housing package in accordance with embodiments of the invention will be described in detail with reference to drawings.

As shown in FIGS. 1 to 4, a semiconductor device housing package 1 of the present embodiment comprises: a base body 5 having, on its upper surface, a mounting region for placement of a semiconductor device 3; and a frame body 7 having a frame-like portion disposed on the upper surface of the base body 5, surrounding the mounting region, and an opening penetrating through from the inner side of the frame-like portion to the outer side thereof. In addition, the semiconductor device housing package 1 also comprises: a flat plate-like insulating member 9 disposed in the opening, extending from the interior of the frame body 7 to the exterior thereof; first wiring conductors 11 serving as a plurality of wiring conductors disposed on the upper surface of the insulating member 9, extending from the interior of the frame body 7 to the exterior thereof (hereafter also referred to as "wiring conductors 11"); and a first metallic film 35 disposed on a part of the upper surface of the insulating member 9, the first metallic film 35 lying outside the frame body 7 surrounding the plurality of wiring conductors 11 (hereafter also referred to as "metallic film 35").

A semiconductor apparatus 101 comprises: the semiconductor device housing package 1; the semiconductor device 3 mounted in the mounting region; and a metal-made lid body 23 joined to the frame body 7 for the sealing of the semiconductor device 3. Moreover, an electronic apparatus 102 of this embodiment comprises: the semiconductor apparatus 101; a mounting board 33 on which is placed the semiconductor apparatus 101; an electronic component 29 mounted on the mounting board 33; and a resin substrate 19 for providing electrical connection between the electronic component and the plurality of wiring conductors 11 of the semiconductor apparatus 101.

In the case of using, as wirings for electrically connecting the first wiring conductors 11 constituting an input-output terminal 13 to third wiring conductors 27, the resin substrate 19 (flexible substrate) having a plurality of second wiring conductors 17, in contrast to the case of using a lead terminal as the aforementioned wiring, it is possible to reduce the possibility of electrical short-circuiting between the second wiring conductors 17. This is because, where the resin substrate 19 having the plurality of second wiring conductors 17 is used, in the course of manufacture of the semiconductor apparatus 101 or at the time of its use, in addition to a force entailed by elastic deformation of the second wiring conductors 17, a force entailed by elastic deformation of a resin member 15 is also applied to a junction with the first wiring conductors 11, and besides the clearance between the plurality of second wiring conductors 17 is secured by the resin substrate 19.

The semiconductor device housing package 1 has a joining member 21 disposed on the upper surface of the input-output terminal 13 so as to surround one ends of, respectively, the first wiring conductors 11, for joining the input-output terminal 13 to the resin substrate 19. Since the joining member 21 is disposed on the upper surface of the input-output terminal 13 so as to surround one end of each of the first wiring conductors 11, it follows that the force resulting from the elastic deformation of the resin substrate 19 is dispersed on the mating faces of the joining member 21 and the resin substrate 19, wherefore transmission of the force from the resin substrate 19 to the input-output terminal 13 and the first wiring conductors 11 can be suppressed. This helps reduce the possibility that the first wiring conductors 11 will be subjected to a force of high strength. As a result, the joinability of the second wiring conductors 17 to the wiring conductors 11 can be enhanced.

The base body 5 is shaped like a quadrangular plate and has, on its upper surface, the mounting region for placement of the semiconductor device 3. In this embodiment, the base body 5 is configured to include a quadrangular plate portion, and screw-mounting hole 31-bearing portions formed so as to protrude laterally from four corners, respectively, of the quadrangular plate portion. With the screw-mounting holes 31, the semiconductor device housing package 1 can be fastened to the mounting board 33 by screws, and thus, the semiconductor device housing package 1 can be fixed to the mounting board 33. Note that, in this embodiment, the mounting region refers to a region of the base body 5 situated in overlapping relation with the semiconductor device 3 as seen in a plan view.

While the mounting region of this embodiment is formed centrally of the upper surface of the base body 5, considering that a region where the semiconductor device 3 is to be mounted is defined as the mounting region, for example, the mounting region may be formed at an end part of the upper surface of the base body 5. Moreover, while, in this embodiment, the base body 5 is formed with a single mounting region, a plurality of mounting regions may be provided in the base body 5, and in this case, the semiconductor device 3 is mounted in each of the mounting regions.

In the mounting region on the base body 5, the semiconductor device 3 is disposed. Thereby, it is possible to input and output signals between the semiconductor device 3 and an external electric circuit via the input-output terminal 13 and so forth. Thus, since the semiconductor device 3 is disposed on the upper surface of the base body 5, it is necessary to design the base body 5 so that at least a part thereof where the semiconductor device 3 is to be disposed can exhibit high insulation property. The base body 5 is constructed by stacking a plurality of insulating members on top of each other. The semiconductor device 3 is disposed in the mounting region of the thusly constructed base body 5. For example, a ceramic material such as an aluminum oxide sintered body, a mullite sintered body, a silicon carbide sintered body, an aluminum nitride sintered body, or a silicon nitride sintered body, or a glass ceramic material can be used for the insulating member.

Now, a method for producing the base body 5 will be described. First, a mixture component is prepared by mixing raw material powder containing powdery glass or powdery ceramic, an organic solvent, and a binder. The mixture component is molded into sheets, thereby forming a plurality of ceramic green sheets. The plurality of ceramic green sheets are stacked on top of each other to obtain a plurality of stacked bodies. The base body 5 can be produced by firing each of the plurality of stacked bodies integrally at a temperature of about 1600° C. Note that the base body 5 is not limited to the structure in which the plurality of insulating components are stacked, but may be made of a single insulating member.

Moreover, while the semiconductor device 3 may be mounted directly on the upper surface of the base body 5, as with the semiconductor device housing package 1 of this embodiment, the base body 5 may be made of a material of metal such as iron, copper, nickel, chromium, cobalt, or tungsten, which is formed by subjecting an ingot of such metal to metalworking process such as rolling process or punching process, or an alloy containing one of those metal materials, or the like material, and also the base body 5 may be provided with a mounting substrate 25 for placement of the semiconductor device 3, and, in this case, the semiconductor device 3 can be mounted on the mounting substrate 25. For the sake of ensuring insulation to the base body 5, for example, a ceramic material such as an aluminum oxide sintered body, a mullite sintered body, a silicon carbide sintered body, an aluminum nitride sintered body, or a silicon nitride sintered body, or a glass ceramic material is used for the mounting substrate 25.

The semiconductor device housing package 1 includes the frame body 7 disposed on the upper surface of the base body 5, surrounding the mounting region. For example, a ceramic material such as an aluminum oxide sintered body, a mullite sintered body, a silicon carbide sintered body, an aluminum nitride sintered body, or a silicon nitride sintered body, or a glass ceramic material can be used for the frame body 7. Also, for example, a metal material such as iron, copper, nickel, chromium, cobalt, or tungsten, or an alloy containing one of those metal materials can be used for the frame body 7. The frame body 7 can be formed by subjecting an ingot of such metal to metalworking process such as rolling process or punching process. Moreover, the frame body 7 may either be made of a single member or be given a multilayer structure of a plurality of members. The frame body 7 is connected to the base body 5 via a joining member. As the joining member, a brazing material such for example as silver solder can be used.

In the semiconductor device housing package 1, in the opening of the frame body 7 is fixedly inserted the input-output terminal 13. The input-output terminal 13 includes the insulating member 9 and the plurality of first wiring conductors 11 disposed on the upper surface of the insulating member 9. The plurality of first wiring conductors 11 are arranged extending, from within the region surrounded by the frame body, outward beyond the region, with their one ends located outside the frame body 7. The plurality of first wiring conductors 11 permit electrical connection between within and without the region surrounded by the frame body 7. The plurality of first wiring conductors 11 are arranged at predetermined spacing to avoid electrical short-circuiting between them. The spacing between the plurality of first wiring conductors 11 falls in a range of about 0.3 mm to 1.5 mm.

The insulating member 9 is shaped like a quadrangular plate and has the plurality of first wiring conductors 11 disposed on its upper surface. As the insulating member 9, it is possible to use a quadrangular plate-like member which is, in terms of exemplificative dimension, about 1 to 20 mm in the length of one side thereof as seen in a plan view, and is about 0.5 to 2 mm in thickness. For example, a ceramic material such as an aluminum oxide sintered body, a mullite sintered body, a silicon carbide sintered body, an aluminum nitride sintered body, or a silicon nitride sintered body, or a glass ceramic material can be used for the insulating member 9.

For example, a metal material such as tungsten, molybdenum, nickel, copper, silver, or gold, or an alloy containing one of such metal materials can be used for the first wiring conductors 11. The first wiring conductors 11 permit electrical connection between the semiconductor device 3 and an external electric circuit via the second wiring conductors 17 and so forth. The first wiring conductors 11 may be so configured that a part thereof is buried in the insulating member 9.

In the case where the frame body 7 is made of a metal material, for the sake of ensuring insulation between the frame body 7 and the first wiring conductors 11, in the range of the opening of the frame body 7, an insulating member 10 is interposed between the first wiring conductors 11 and the frame body 7.

One ends of the first wiring conductors 11 situated outside the frame body 7 are surrounded by the joining member 21 disposed on the upper surface of the input-output terminal 13. In other words, parts of the first wiring conductors 11 which lie outside the frame body 7 are surrounded by the frame body 7 and the joining member 21. Thus, since one ends of, respectively, the first wiring conductors 11 are surrounded by the joining member 21, even if the resin substrate 19 undergoes elastic deformation, it is possible to avoid application of a force of high strength to the junction of the first wiring conductors 11 with the second wiring conductors 17.

The joining member 21 is intended to join the input-output terminal 13 to the resin substrate 19. For example, a resin material such as silicone resin, acrylic resin, or epoxy resin, or a metal material such as solder can be used for the joining member 21. Exemplary of solder are SnAgCu solder, SnZnBi solder, SnCu solder, and SnAgInBi solder.

In the case of using a metal material such as solder for the joining member 21, for the sake of enhancing the joinability of the input-output terminal 13 to the joining member 21, on the upper surface of the insulating member 9, the first metallic film 35 is disposed lying between the insulating member 9 and the joining member 21 in overlapping relation with the joining member 21 as seen in a plan view. For example, the first metallic film 35 can be formed through metallization of a metal material. Moreover, in the case of using a metal material such as solder for the joining member 21, for the sake of preventing electrical short-circuiting between the joining member 21 and the first wiring conductors 11, a clearance of 0.3 to 1.5 mm is created between the first metallic film 35 and the first wiring conductors 11.

Moreover, the first metallic film 35 may be electrically connected to a ground line. Since one ends of, respectively, the plurality of first wiring conductors 11 are surrounded by the first metallic film 35 or solder, where the first metallic film 35 is electrically connected to a ground line, it is possible to minimize electromagnetic leakage of input-output signals from one end of each of the plurality of first wiring conductors 11. Accordingly, attenuation of input-output signals can be suppressed. Furthermore, in the electronic apparatus 102 employing the semiconductor device housing package 1, it is possible to minimize electromagnetic influence exerted on the electronic component 29 mounted on the mounting board 33 due to the leakage of input-output signals to the outside.

As used herein, the term "ground" refers to electrical connection to external reference potential, or so-called earth potential, but, the reference potential does not necessarily have to be 0 V in potential level.

Figure 4:
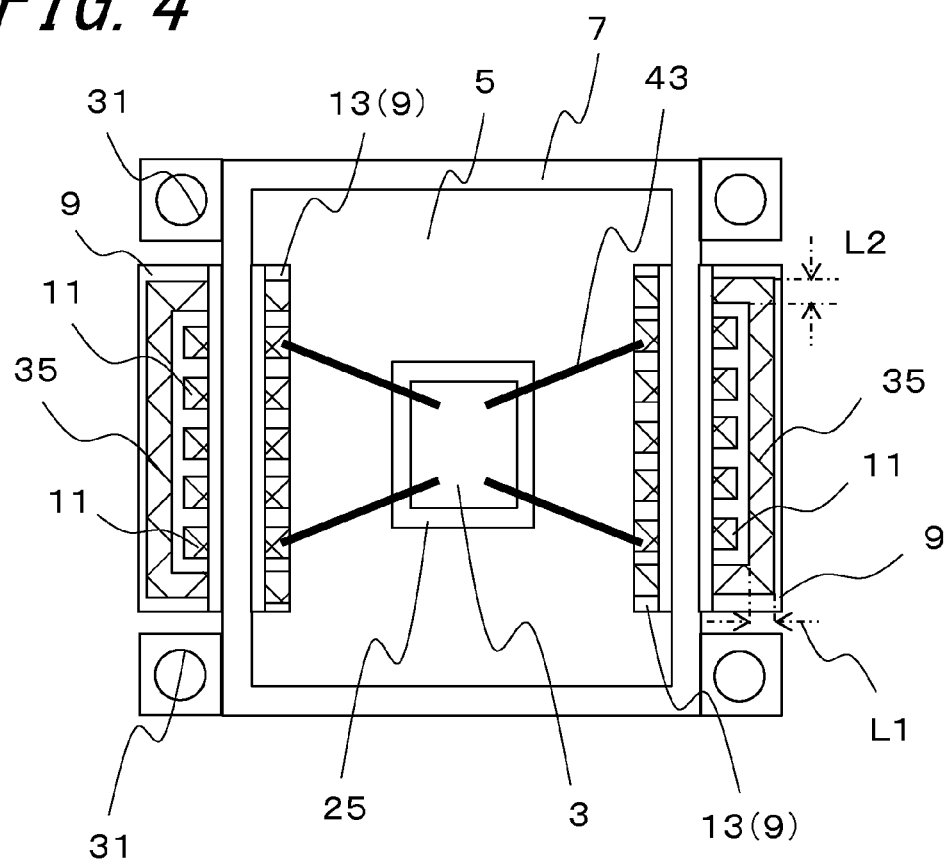
FIG. 4 is a plan view of the semiconductor device housing package and the semiconductor apparatus shown in FIG. 2.

As shown in FIGS. 4 and 6(a), in the semiconductor device housing package 1, the first metallic film 35 disposed on the upper surface of the insulating member 9 is spaced inwardly of the outer edge of the insulating member 9 as seen in a plan view. In other words, a clearance exists between the outer edge of the insulating member 9 and the first metallic film 35 disposed on the upper surface of the insulating member 9.

As shown in FIG. 6(b), the first metallic film 35 disposed on the upper surface of the insulating member 9 may be configured to extend to the outer edge of the insulating member 9 as seen in a plan view. By configuring the first metallic film 35 to extend to the outer edge of the insulating member 9, it is possible to minimize electromagnetic leakage of input-output signals traveling through the first wiring conductors 11 in an effective manner. Moreover, even if the resin substrate 19 becomes elastically deformed, since the first metallic film 35 extends to the outer edge of the insulating member 9 as seen in a plan view, it never occurs that the resin substrate 19 is brought into contact with the upper surface and end of the insulating member 9, wherefore development of a flaw in the resin substrate 19 and in the second wiring conductor 17, as well as occurrence of breakage in the second wiring conductor 17, caused by the contact of the resin substrate 19 with the insulating member 9 can be suppressed, and it is also possible to ensure insulation between the input-output terminal 13 and the second wiring conductor 17. Furthermore, as shown in FIG. 6(b), where the first metallic film 35 disposed on the upper surface of the insulating member 9 extends to the outer edge of the insulating member 9, it is preferable that a second metallic film 37 is disposed on a side surface of the insulating member 9, and the second metallic film 37 disposed on the side surface of the insulating member 9 merges with the first metallic film 35 disposed on the upper surface of the insulating member 9. In this case, electromagnetic leakage of input-output signals can be minimized effectively by both of the first metallic film 35 and the second metallic film 37, and also the insulating member 9 and the resin substrate 19 can be joined to each other via the first and second metallic films 35 and 37 and the joining member 21 with enhanced joinability.

As shown in FIG. 7, where the second metallic film 37 is disposed on the side surface of the insulating member 9, it is preferable that there are provided groove portions 45 (castellations) which extend from the upper surface of the insulating member to the side surface of the insulating member, and the second metallic film 37 is disposed lying also on the inner surfaces of the groove portions. This makes it possible to achieve further enhancement in the joinability of the first and second metallic films 35 and 37 to the insulating member 9, as well as to achieve further enhancement in the joinability of the first and second metallic films 35 and 37 to the solder acting as the joining member 21.

As shown in FIG. 8(a), the first metallic film 35 may have a part 35A which extends into between the plurality of first wiring conductors 11. So long as the part 35A is formed surrounding each of the plural first wiring conductors 11 left exposed outside the frame body 7, it is possible to secure a large space for surrounding the first wiring conductors 11 left exposed outside the frame body 7 and thereby minimize electromagnetic leakage of input-output signals traveling through the first wiring conductors 11 in an effective manner, and also, where the first metallic film 35 stands at the reference potential, electromagnetic coupling can be ensured effectively between the first wiring conductors 11 and the first metallic film 35.

As shown in FIG. 8(b), the part 35A of the first metallic film 35 may be formed surrounding two of the plurality of first wiring conductors 11 left exposed outside the frame body 7 together as a group. The grouped two first wiring conductors 11 taken as a pair serve as, for example, a differential line, and, where the first metallic film 35 stands at the reference potential, the first metallic film 35 is capable of effective establishment of electromagnetic coupling with the pair of first wiring conductors 11 while suppressing external electromagnetic influence on the pair of first wiring conductors 11.

It is preferable that the area of junction of the joining member 21 with the resin substrate 19 is larger than the area of junction of the second wiring conductor 17 with the first wiring conductor 11. As has already been presented, even if the resin substrate 19 becomes elastically deformed, the force entailed by the elastic deformation is dispersed at the junction between the joining member 21 and the resin substrate 19, wherefore transmission of the force from the resin substrate 19 to the input-output terminal 13 can be suppressed. Where the area of the junction between the joining member 21 and the resin substrate 19 is so large that the force exerted on the junction between the joining member 21 and the resin substrate 19 can be dispersed greatly, the force transmitted from the resin substrate 19 to the input-output terminal 13 can be lessened. By adjusting the area of junction of the joining member 21 with the resin substrate 19 to be larger than the area of junction of the second wiring conductor 17 with the first wiring conductor 11, it is possible to allow sufficient dispersion of the force at the junction between the joining member 21 and the resin substrate 19.

As shown in FIG. 4, it is preferable that a longitudinal width L1 of a part of the joining member 21 which is located ahead of the first wiring conductor 11 in the longitudinal direction is larger than a transverse width L2 of a part thereof which is located ahead of the first wiring conductor 11 in the transverse direction. When the resin substrate 19 becomes elastically deformed, the part of the joining member 21 which is located ahead of the first wiring conductor 11 in the longitudinal direction is more susceptible to a force of high strength than is the part thereof which is located ahead of the first wiring conductor 11 in the transverse direction. Where the joining member 21 is disposed in the manner as shown in FIG. 4, the resin substrate 19 and the input-output terminal 13 can be joined to each other via the joining member 21 with excellent joinability without the necessity of upsizing the input-output terminal 13 excessively or excessive use of the joining member 21.

Figure 3:
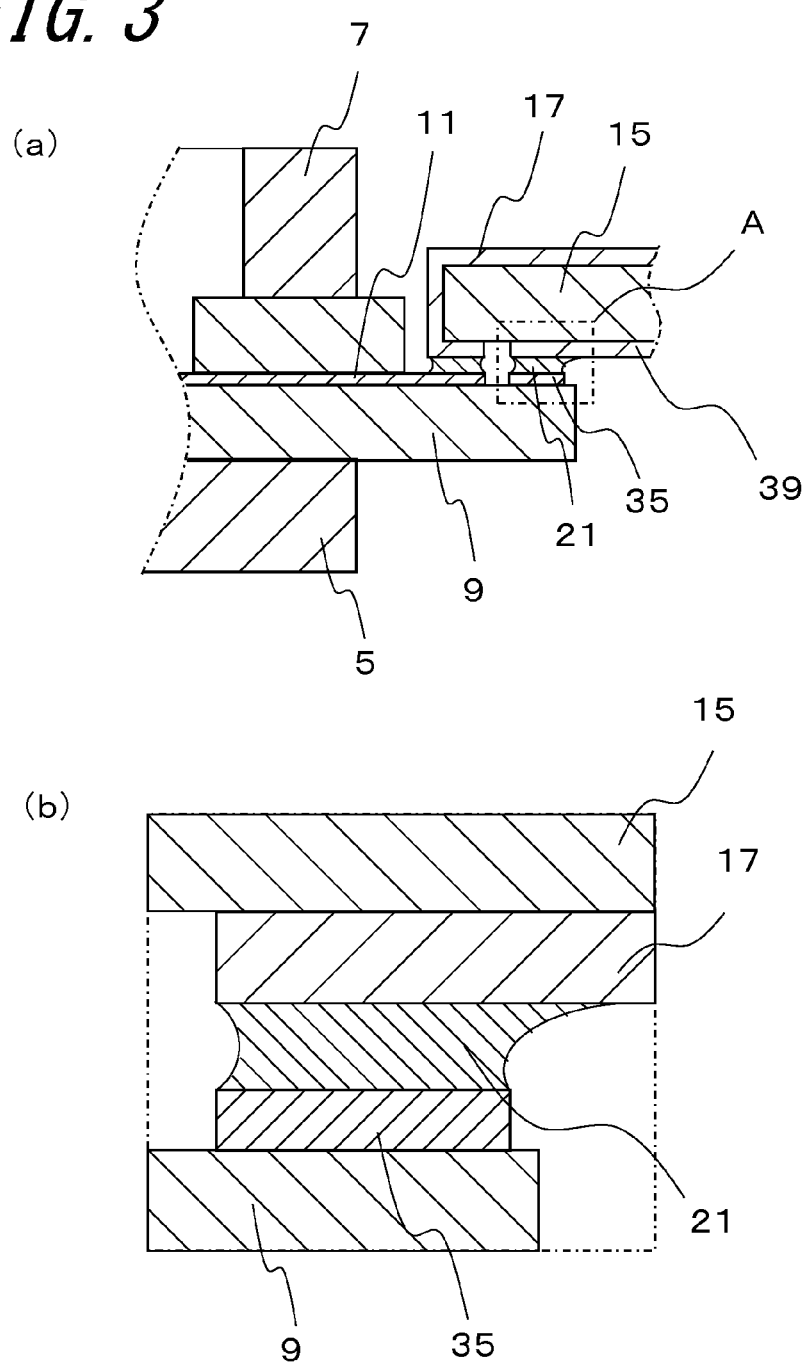
FIG. 3($a$) is an enlarged sectional view of the semiconductor device housing package and the semiconductor apparatus shown in FIG. 2, illustrating a part near a joining member in X-X section, and FIG. 3($b$) is an enlarged sectional view of a region A shown in FIG. 3($a$)

As shown in FIG. 3, it is preferable that the side surface of the joining member 21 has a concavely curved profile in section perpendicular to the upper surface of the insulating member 9 and orthogonal to the longitudinal direction of the first wiring conductors 11. Where the sectional profile of the side surface is defined by a concave curve, expressed differently, a so-called constriction, the joining member 21 becomes elastically deformable. Accordingly, the force resulting from the elastic deformation of the resin substrate 19 can be dispersed readily at the joining member 21.

Moreover, where the side surface has a concavely curved profile, the area of junction between the joining member 21 and the input-output terminal 13, as well as the area of junction between the joining member 21 and the resin substrate 19, can be increased. Accordingly, the joinability of the joining member 21 and the input-output terminal 13, as well as the joinability of the joining member 21 and the resin substrate 19, can be enhanced.

The resin substrate 19 is joined to the input-output terminal 13, with the joining member 21 interposed between them. The resin substrate 19 is constructed by disposing, on the sheet-like or plate-like resin member 15, the second wiring conductors 17, the ends of which extend over the lower surface of the resin member 15 are connected to the first wiring conductors 11. More specifically, as the resin substrate 19, it is possible to use a flexible substrate, or a so-called FPC (Flexible-Printed-Circuit) substrate constructed by forming connection wiring acting as the second wiring conductors 17 on the resin member 15 made of a film of resin such as polyimide or a liquid crystal polymer-made base film. That is, the resin substrate 19 can be bent and folded.

Figure 5:
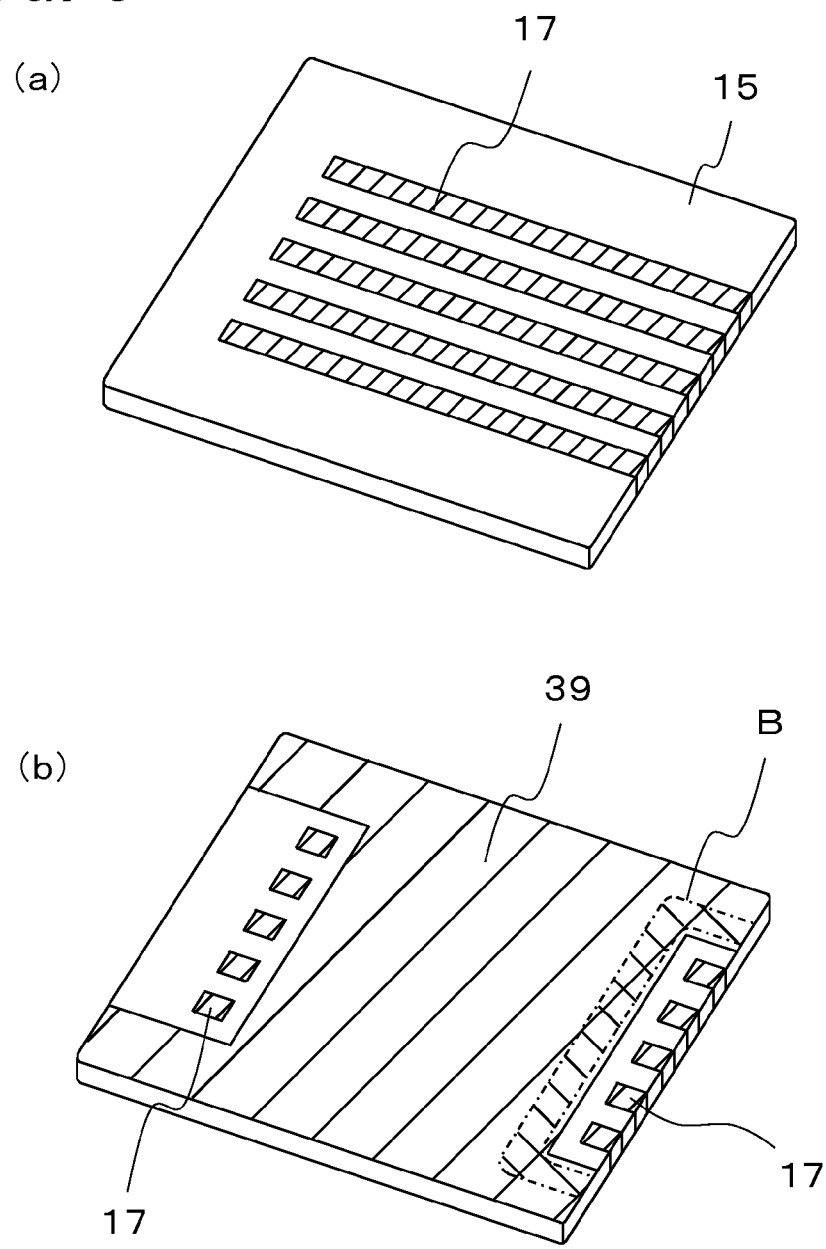
FIG. 5($a$) is a perspective view showing a top side of a resin substrate provided in the semiconductor device housing package shown in FIG. 1, and FIG. 5($b$) is a perspective view showing a bottom side of the resin substrate shown in FIG. 5($a$)

Moreover, in the case of using a metal material such as solder for the joining member 21, as shown in FIG. 5, it is desirable to dispose a third metallic film 39 on the lower surface of the resin member 15, surrounding the ends of the second wiring conductors 17 connected to the first wiring conductors 11. This makes it possible to enhance the joinability of the resin substrate 19 to the joining member 21. In the case of FIG. 5, the joining member 21 is bonded to a region B of the third metallic film 39.

Furthermore, in the case of disposing a metallic film which exhibits good wettability to solder on the lower surface of the resin member 15, the joining member 21 is restrained from spreading wettingly over an unintended location on the lower surface of the resin member 15. Accordingly, a situation such as a contact of the joining member 21 with the end of the second wiring conductor 17 can be avoided.

It is preferable that the junction of the joining member 21 with the resin substrate 19 is larger in area than the junction of the joining member 21 with the input-output terminal 13. When the resin substrate 19 becomes elastically deformed, the force resulting from the deformation tends to be exerted more greatly on the joining surface of the joining member 21 and the resin substrate 19 than on the joining surface of the joining member 21 and the input-output terminal 13. In the semiconductor device housing package 1, the area of the joining surface of the joining member 21 and the resin substrate 19 that is relatively susceptible to a force of high strength is larger than the area of the joining surface of the joining member 21 and the input-output terminal 13. This makes it possible to join the resin substrate 19 to the input-output terminal 13 through the joining member 21 with stability. Accordingly, the joinability of the second wiring conductor 17 to the first wiring conductor 11 can be enhanced.

The semiconductor apparatus 101 of this embodiment comprises: the package 1 typified by the embodiment thus far described; the semiconductor device 3 placed in the mounting region; and the metal-made lid body 23 joined to the frame body 7 for the sealing of the semiconductor device 3. Moreover, the electronic apparatus 102 of this embodiment comprises: the above-described semiconductor apparatus 101; the mounting board 33 on which is placed the semiconductor apparatus 101; the third wiring conductors 27 disposed on the mounting board 33 so as to be connected to the second wiring conductors 17; and the electronic component 29 disposed on the mounting board 33 in overlapping relation with the resin substrate 19 vertically.

The semiconductor device housing package 1 is fastened, at the screw-mounting holes 31 provided in the base body 5, to the mounting board 33 by screws. In the semiconductor apparatus 101, the semiconductor device 3 is mounted in the mounting region of the base body 5. Moreover, the semiconductor device 3 is connected to the first wiring conductors 11 surrounded with the frame body 7 by bonding wires 43. By inputting an external signal to the semiconductor device 3 through the second wiring conductors 17 of the resin substrate 19 and so forth, intended output can be produced from the semiconductor device 3. Examples of the semiconductor device 3 include light-emitting devices for light emission to fiber optics typified by a LD element and light-receiving devices for light reception from fiber optics typified by a PD element.

The lid body 23 is joined to the frame body 7 for the sealing of the semiconductor device 3. The lid body 23 is bonded to the upper surface of the frame body 7. Thus, the semiconductor device 3 is sealed in a space surrounded with the base body 5, the frame body 7, and the lid body 23. The semiconductor device 3, being sealed in this way, can be made less prone to deterioration from long-term use of the semiconductor device housing package 1. For example, a metal material such as iron, copper, nickel, chromium, cobalt, or tungsten, or an alloy made of such metal materials can be used for the lid body 23. Moreover, the frame body 7 and the lid body 23 can be joined to each other by means of seam welding, for example. Also, the frame body 7 and the lid body 23 may be joined to each other with use of gold-tin brazing material.

The electronic apparatus 102 includes the third wiring conductors 27 disposed on the mounting board 33 so as to be connected to the second wiring conductors 17. More specifically, an insulating plate 41 having second connecting conductors disposed on its upper surface is disposed on the mounting board 33. The third wiring conductors 27 are connected to the second wiring conductors 17, so that it is possible to input and output signals between the semiconductor device 3 and an external electric circuit via the second wiring conductors 17, the third wiring conductors 27, and so forth.

For example, a ceramic material such as an aluminum oxide sintered body, a mullite sintered body, a silicon carbide sintered body, an aluminum nitride sintered body, or a silicon nitride sintered body, a glass ceramic material, or a resin material can be used for the insulating plate 41. Moreover, as the third wiring conductor 27, as with the first wiring conductor 11, a highly electrically conductive member is desirable for use. More specifically, a metal material such as tungsten, molybdenum, nickel, copper, silver, or gold, or an alloy containing one of such metal materials can be used for the third wiring conductor 27. Furthermore, as an alternative to the insulating plate 41, a connection pin electrically connected to electrical wiring formed on the mounting board 33 may be disposed on the upper surface of the mounting board 33. In this case, the connection pin is inserted into a through hole formed in the resin substrate 19 in electrically conducting relation with the wiring conductor of the insulating substrate 19, and is then fixed in place by an electrically conductive member such as solder, thereby establishing electrical connection with the mounting board 33.

Moreover, on the mounting board 33, the electronic component 29 is mounted. Then, by locating the electronic component 29 in overlapping relation with the resin substrate 19 vertically, the electronic apparatus 102 can be downsized. In addition, where the third metallic film 39 electrically connected to the ground line is disposed on the lower surface of the resin member 15, the electromagnetic influence of input-output signals traveling through the second wiring conductors 17 can be minimized. More specifically, where the third metallic film 39 is disposed on the lower surface of the resin member 15, since the third metallic film 39 serving as a ground electrode is situated between the second wiring conductors 17 and the electronic component 29, it is possible to minimize the electromagnetic influence of input-output signals traveling through the second wiring conductor 17.

Up to this point the semiconductor device housing package 1 in accordance with one embodiment of the invention, and the semiconductor apparatus 101 as well as the electronic apparatus 102 equipped with the semiconductor device housing package 1 have been described, but it should be noted that the application of the invention is not limited to the embodiments as described heretofore. That is, various changes and modifications, and combinations of the embodiments are possible without departing from the scope of the invention.

What is claimed is:

1. A semiconductor device housing package, comprising:
   a base body having, on its upper surface, a mounting region of a semiconductor device;
   a frame body having a frame-like portion disposed on the upper surface of the base body, surrounding the mounting region, and an opening penetrating through from an inner side of the frame-like portion to an outer side thereof;
   a flat plate-like insulating member disposed in the opening, extending from an interior of the frame body to an exterior thereof;
   a plurality of wiring conductors disposed on an upper surface of the flat plate-like insulating member, extending from the interior of the frame body to the exterior thereof; and
   a metallic film disposed on a part of the upper surface of the flat plate-like insulating member, the metallic film lying outside the frame body surrounding the plurality of wiring conductors.

2. The semiconductor device housing package according to claim 1,
   wherein the metallic film is disposed from the upper surface of the flat plate-like insulating member to a side surface of the flat plate-like insulating member.

3. The semiconductor device housing package according to claim 1,
   wherein part of the metallic film extends into between the plurality of wiring conductors.

4. The semiconductor device housing package according to claim 1,
   wherein the flat plate-like insulating member has a groove portion which extends from the upper surface thereof to a side surface thereof.

5. A semiconductor apparatus, comprising:
   the semiconductor device housing package according to claim 1;

a semiconductor device mounted in the mounting region; and a metal-made lid body joined to the frame body to covering the semiconductor device.

6. An electronic apparatus, comprising:

the semiconductor apparatus according to claim 5;

a mounting board on which the semiconductor apparatus is mounted;

an electronic component mounted on the mounting board; and a resin substrate having second wiring conductors which differ from the plurality of wiring conductors, the second wiring conductors being electrically connected to the plurality of wiring conductors.

* * * * *